(12) United States Patent
Rosenberg et al.

(10) Patent No.: US 6,876,004 B2
(45) Date of Patent: Apr. 5, 2005

(54) CIRCUIT INTERCONNECT FOR OPTOELECTRONIC DEVICE FOR CONTROLLED IMPEDANCE AT HIGH FREQUENCIES

(75) Inventors: Paul K. Rosenberg, Sunnyvale, CA (US); Daniel K. Case, Gilroy, CA (US); Jan Lipson, Cupertino, CA (US); Rudolf J. Hofmeister, Sunnyvale, CA (US); The' Linh Nguyen, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 393 days.

(21) Appl. No.: 10/005,924

(22) Filed: Dec. 4, 2001

(65) Prior Publication Data

US 2003/0102157 A1 Jun. 5, 2003

(51) Int. Cl.$^7$ ......................... H01L 29/267; G02B 6/36; G02F 1/29
(52) U.S. Cl. ............................. 257/81; 257/83; 257/98; 257/99; 257/433; 385/89; 385/92; 385/94; 359/316
(58) Field of Search ................................. 359/244, 315, 359/316, 319; 385/39, 49, 88–94; 257/80–84, 98, 99, 431–433; 438/29, 31, 110; 361/748, 749, 752, 753

(56) References Cited

U.S. PATENT DOCUMENTS

| | | | | |
|---|---|---|---|---|
| 4,691,386 A | * | 9/1987 | Eumurian et al. | 398/139 |
| 5,768,456 A | * | 6/1998 | Knapp et al. | 385/49 |
| 6,668,113 B2 | * | 12/2003 | Togami et al. | 385/33 |
| 2003/0142929 A1 | * | 7/2003 | Bartur et al. | 385/92 |
| 2003/0178657 A1 | * | 9/2003 | Nguyen et al. | 257/292 |
| 2003/0179558 A1 | * | 9/2003 | Giaretta et al. | 361/777 |
| 2003/0180013 A1 | * | 9/2003 | Rosenberg et al. | 385/92 |
| 2004/0184742 A1 | * | 9/2004 | Sabbatino et al. | 385/92 |

OTHER PUBLICATIONS

"Technique to View Electroluminescence Along the cavity of Packaged Laser Diodes", Oct. 1, 1990, IBM Technical Disclosure Bulletin, vol. 33, p. 159.*

* cited by examiner

Primary Examiner—Alonzo Chambliss
(74) Attorney, Agent, or Firm—Workman Nydegger

(57) ABSTRACT

An optoelectronic assembly includes a transistor outline (TO) package that houses an optoelectronic device. The TO package and the optoelectronic device are coupled to a circuit interconnect. The circuit interconnect includes an insulator having a first side for transmitting a signal current between the optoelectronic device and a device external to the TO package, and a second side for transmitting a ground current between the TO package and the external device. For a predefined operating frequency range, the impedance of the circuit interconnect approximately matches the impedance of the signal leads of the TO package and also approximately matches the impedance of the device external to the TO package. The optoelectronic device may include a laser diode or a photo diode. In addition, the present invention is an optoelectronic transceiver including a transmitter optoelectronic assembly and a receiver optoelectronic assembly. The transmitter optoelectronic assembly includes a transmitter TO package and a transmitter circuit interconnect, and the receiver optoelectronic assembly includes a receiver TO package and a receiver circuit interconnect.

8 Claims, 9 Drawing Sheets

Transmitter Assembly 400

CIRCUIT INTERCONNECT FOR OPTOELECTRONIC DEVICE FOR CONTROLLED IMPEDANCE AT HIGH FREQUENCIES

BACKGROUND OF THE INVENTION

An optoelectronic device, such as a laser diode or a photo diode, is generally enclosed in a transistor outline (TO) package, which provides a conductive housing for the optoelectronic device. A laser diode converts an electrical signal into an optical signal for transmission over a fiber optic cable, while a photo diode converts an optical signal into an electrical signal. In order for a laser diode to convert an electrical signal into an optical signal, the electrical signal must be sent through the TO package of the laser diode. Similarly, an electrical signal from a photo diode must be sent through the TO package of the photo diode to external electrical circuitry. For high frequency operation, it is important to control the impedance seen by the electrical signals that flow into and out of the TO package.

Conventional signal and ground connections to TO packages, which including distinct signal and ground connections, result in uncontrolled impedances that degrade data signal integrity at high frequencies (e.g., at or above 3 GHz).

SUMMARY OF THE INVENTION

The present invention enables optoelectronic devices packaged in transistor outline (TO) packages to operate at high frequencies.

The present invention is an optoelectronic assembly that includes a TO package that houses an optoelectronic device. The TO package includes a base and a signal lead that traverses an aperture in the base. Both the base of the TO package and signal lead are coupled to a circuit interconnect. The circuit interconnect includes an insulator having signal trace on a first side for transmitting a signal current between the optoelectronic device and an external circuit, and a second side having a ground signal conductor for transmitting a ground current between the TO package and the external circuit. The geometry of the circuit interconnect is configured so that at high frequencies its impedance approximately matches the impedance of both the circuitry inside the TO package and the external circuit. Matching the impedances avoids or minimizes signal reflections and improves the transmission of data signals.

In an embodiment of the present invention, the portion of the signal lead traversing the base is surrounded by an insulator ring that isolates the signal lead from the base and the insulator is surrounded by a ground ring that is electrically and mechanically bonded to the ground signal conductor on the second side of the circuit interconnect.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENTS

Figure 1:
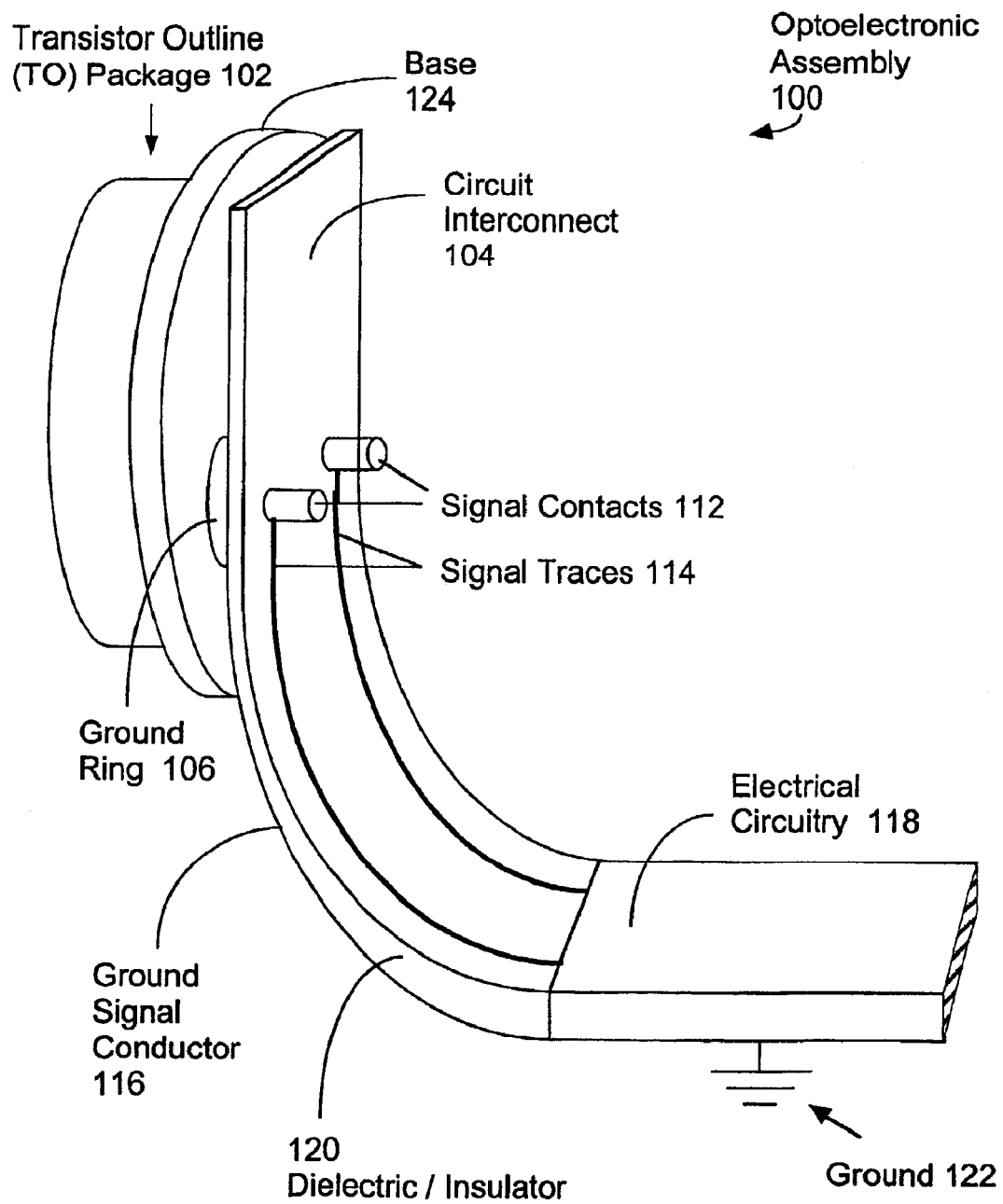
FIG. 1 is a diagram of an optoelectronic assembly in accordance an embodiment of the invention.

Referring to FIG. 1, there is shown an embodiment of an optoelectronic assembly 100 in accordance with the present invention. The optoelectronic assembly may be a transmitter optoelectronic assembly or a receiver optoelectronic assembly. The optoelectronic assembly includes a transistor outline (TO) package 102 that houses an optoelectronic device. If the optoelectronic assembly is a transmitter optoelectronic assembly, the optoelectronic device is a light source such as a laser diode. If the optoelectronic assembly is a receiver optoelectronic assembly, the optoelectronic device is a detector such as a photo diode.

Signal contacts 112, also called signal leads, extend through apertures in the base 124 of the TO package 102 and contact corresponding signal traces 114 on a circuit interconnect 104. The signal traces 114 are mechanically and electrically connected to the signal contacts 112 by solder, conductive epoxy or any other appropriate conductive attachment mechanism. Signal contacts 112 and signal traces 114 convey power and data signals between an external circuit 118 and the device or devices in the TO package 102.

The circuit interconnect 104 is preferably made of an elongated piece of flexible dielectric 120. The dielectric 120 serves as an insulator between a ground signal conductor 116 on one side of the dielectric 120 and the data signal traces 114 on the other side of the dielectric. The ground signal conductor 116 conveys ground current between the external circuit 118 and the device or devices in the TO package 102. While the embodiment shown in FIG. 1 has two signal contacts 112 and two corresponding signal traces 114, in other embodiments the number signal contacts and signal traces may be greater or fewer, depending on the number of power and data connections needed by the device or devices inside the TO package 102.

The external, back surface of the base 124 is sometimes called the "ground plate," because the base 124 of the TO package is grounded by a connection between the ground plate and the ground conductor 116 on the circuit interconnect 104. The ground connection to the base 124 provides a circuit ground voltage source and ground current connection for the electrical and optoelectronic components in the TO package 102.

To avoid signal reflections and other signal degradations, the impedance of the signal path from the device in the TO package 102 to the external circuit 118 must be kept as consistent as possible. The impedance of the circuit interconnect 104 (i.e., the characteristic impedance of the transmission line formed by the circuit interconnect) is precisely determined by the thickness of the dielectric and the width of the data signal traces, and the circuit interconnect is configured so that for frequencies in the range of 3 to 10 GHz its impedance approximately matches the impedances of both the circuitry inside the TO package and the external circuit 118. As used in this document, two impedances are defined to "approximately match" when the two impedances are either exactly the same or one of the impedances is larger than the other, but no more than 50% larger. In other words, the impedance of the circuit interconnect is within a factor of about 1.5 of the impedance of the circuitry inside the TO package and the external circuit 118. Preferably the impedance of the circuit interconnect will be within 25% (i.e., within a factor of about 1.25) of the impedances of the circuitry inside the TO package and the external circuit 118. The impedance of the circuit interconnect 104 of the present invention is typically between 20 and 30 ohms.

In other embodiments, the circuit interconnect 104 may be optimized for impedance matching (to the high frequency signal leads of the TO package 102, and also to an external circuit) for a different range of operating frequencies than 3 to 10 GHz. Typically, the range of operating frequencies at the circuit interconnect 104 of the present invention approximately matches impedances at both ends of the circuit interconnect 104 will include a range of frequencies above 3 GHz.

In a preferred embodiment the circuit interconnect 104 has a thickness between 0.003 and 0.012 inches, and the dielectric substrate 120 of the circuit interconnect is preferably polyimide or polyester. Other insulating materials may be used besides polyimide or polyester. Moreover, the insulator 120 does not necessarily need to be flexible; however, the flexibility is useful for fitting the optoelectronic assembly 110 into a housing (not shown), such as the housing of an optoelectronic transmitter, receiver or transceiver. The flexible dielectric substrate 120 is coated on each side with a conductive material such as copper, a copper alloy, or other malleable, highly conductive metal or metal alloy. The data signal traces 114 are fabricated from the conductive material on one side of the circuit interconnect 104, while the entire second side of the circuit interconnect 104 (excluding circular regions corresponding to the positions of the signal leads traversing the base of the TO package) serves as the ground signal conductor 116. Other methods of creating the conductive signal traces may be used as is understood by one skilled in the art.

In an alternate embodiment, only a portion of the second side of the circuit interconnect 104 serves as the ground signal conductor 116, leaving room for one or more additional signal traces (e.g., for power or low frequency data signals) on the second side of the interconnect 104. In this alternate embodiment, the ground signal conductor 116 would be positioned relative to the traces on the first side of the circuit interconnect so as to provide connections with well controlled impedance.

Figure 2:
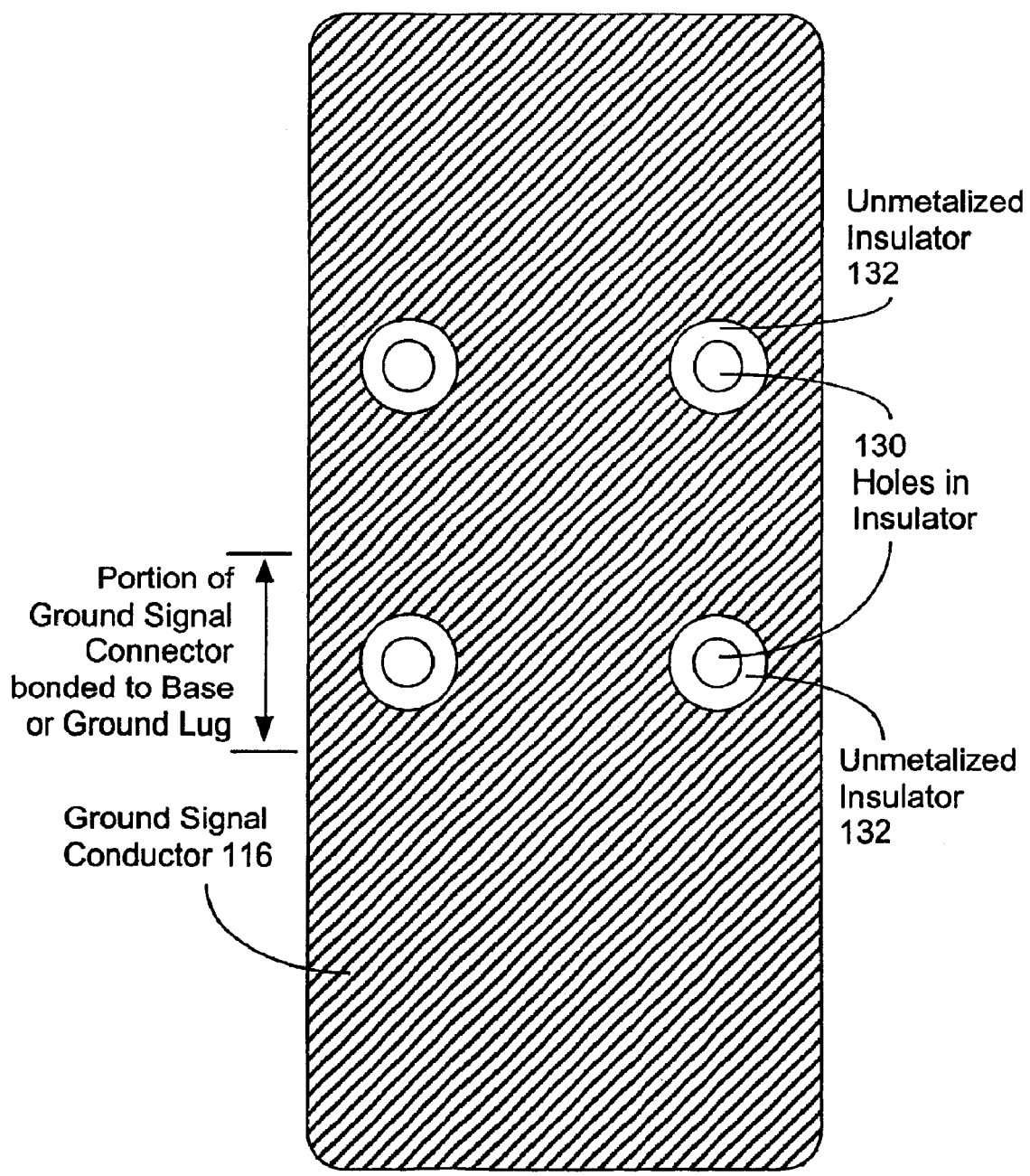
FIG. 2 depicts the ground signal conductor side of a circuit interconnect.

The side of the circuit interconnect 104 that serves as the ground signal conductor 116 is depicted in FIG. 2. The small circular regions 130 represent holes in the dielectric substrate 120 of the interconnect, through which the signal leads of the TO package extend. The annular circular regions 132 surrounding the smaller holes 130 represent non-conductive, unmetalized regions in which the conductive material has been removed from the second side of the circuit interconnect 104 so as to prevent electrical shorts between the signal leads and the ground signal conductor 116.

Returning to FIG. 1, the data signals are transmitted between the optoelectronic device in the TO package 102 and electrical circuitry 118. The data signal contacts 112 extend through apertures in the base 124 of the TO package 102 and contact the data signal traces 114. For each data signal contact 112, a separate, respective ground ring 106 surrounds the data signal contact 112 and is attached to the base 124 of the TO package 102. The base 124 is a circular (actually, cylindrical) metal plate, generally held at the circuit ground voltage during operation of the optoelectronic device. The base 124 is the foundation of the TO package 102. In a preferred embodiment the base 124 is made of a metal known as "Alloy 42," which is an alloy of iron and nickel. In other embodiments the base 124 may be made of other appropriate metals. The primary purpose of the ground rings is to form a low reflection connection between the data signal contacts 112 and the circuit interconnect 104, so as to minimize signal reflections at the interface between the data signal contacts 112 and the circuit interconnect 104. In some embodiments, ground rings 106 are used only with high frequency data signal contacts 112 (e.g., carrying data signals at frequencies at or above 2 or 3 GHz), but not with the power signal contact and any lower frequency data signal contacts, because ground rings 106 are not needed to form low reflection connections between the signal contacts 112 and the circuit interconnect 104 for low frequency connections.

Figure 3A:
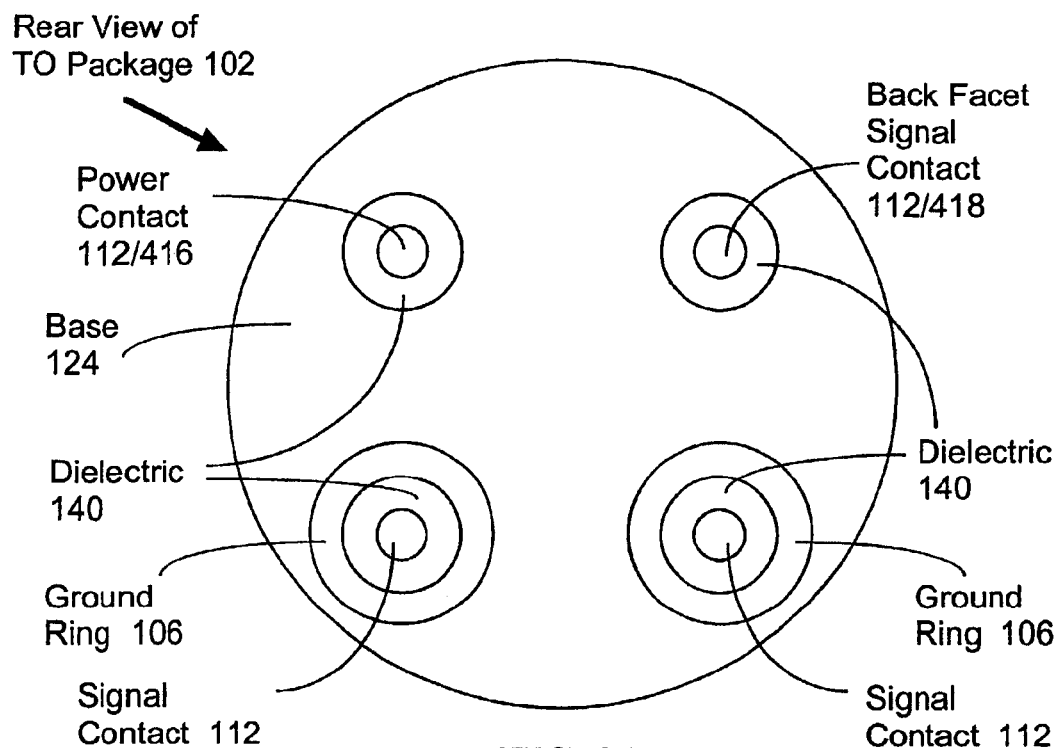
FIGS. 3A and 3B depict the back of a TO package in accordance with the first and second embodiments.

FIG. 3A shows the ground rings 106 on the back surface of the base 124. The ground rings 106 are preferably highly conductive, thin metal rings that are bonded to the back, planar surface of the base 124, such as by solder, conductive epoxy or any other appropriate bonding or conductive attachment mechanism. As a result, the ground rings are mechanically and electrically connected to the back surface of the base 124. The ground rings 106 rise slightly above the back planar surface of the base 124, which facilitates the bonding of the ground signal conductor 116 of the circuit interconnect 104 to the ground rings. Alternately, the ground rings 106 may be implemented as raised annular regions of the base 124, i.e., as integral parts of the base. The circuit ground connection provided by the ground signal conductor 116, which is electrically and mechanically bonded to the ground rings 106, and possibly other portions of the base as well, keeps the entire base 124 at the circuit ground voltage during normal operation. While the ground rings 106 are shown in FIG. 3A as being circular or annular in shape, in other embodiments other shapes could be used. For instance, the ground rings 106 could be oval shaped structures.

Although there are two ground rings 106 surrounding the two data signal contacts, only one ground ring is seen in FIG. 1 because of the angle of the perspective view shown in FIG. 1. The ground signal conductor 116 directly contacts the ground rings 106, and carries ground current from the ground rings 106 to a circuit ground terminal 122 (FIG. 1). In a preferred embodiment, the ground signal conductor 116 also directly contacts the base 124 at the back surface of the TO package 102 so as to provide a high quality ground connection to the entire TO package and the devices therein. These contacts between the ground signal conductor 116 and the ground rings 106 and the back surface of the base 124 are preferably implemented by bonding these components together using solder, conductive epoxy or any other appropriate bonding or conductive attachment mechanism.

The ground signal and the data signals are maintained in a close relationship to each other, separated by the insulator 120. This provides for a controlled impedance at high frequencies.

Referring again to FIG. 1, the electrical circuitry 118 is electrically connected to the circuit interconnect 104. The signal traces 114 contact the electrical circuitry 118 while the ground conductor 116 contacts the electrical circuitry's circuit ground node 122. The electrical circuitry is typically mounted on or includes a circuit board (not shown) and the circuit interconnect is electrically connected to that circuit board. The electrical circuitry 118 amplifies and processes the electrical signals transmitted to a laser diode (in one embodiment) or from a photo diode (in another embodiment), or both (in yet another embodiment). Thus, the electrical circuitry 118 may include a laser driver circuit, a received signal recovery circuit, or both. Further, the electrical circuitry 118 may include digital signal processing circuits, such as serializing circuits and deserializing circuits, and circuits that perform data conversions, such as the 8b/10b conversion for converting a data stream into a "balanced" data stream that is balanced with respect to 1 and 0 bits, and that provides sufficient data transitions for accurate clock and data recovery.

FIG. 3A shows the base 124 at the back of the TO package 102 in one embodiment of the present invention. The signal contacts (leads) 112 carrying data signals and/or a power supply voltage extend through apertures in the base 124 of the TO package 102. The data signal contacts 112 contact the data signal traces 114 (FIG. 1) of the circuit interconnect. The signal contacts 112 do not contact the base 124 of the TO package 102; rather, they extend through a dielectric 140, preferably a ring of glass, embedded in the base 124. Each dielectric ring 140 is concentric with one of the signal contacts 112. When the circuit interconnect 104 is bonded to the base of the TO package 102, the unmetalized insulator region 132 (FIG. 2) on the second side of the circuit interconnect overlaps the dielectric ring 140 in the base 124.

For each data signal contact 112 (or at least each high frequency data signal contact), there is a conductive ground ring 106 that surrounds the dielectric 140, concentric with the contact 112 and the dielectric ring 140.

In some embodiments, the ground rings 106 are the only parts of the TO package that directly contact the ground signal conductor 116 of the circuit interconnect. In one embodiment, however, the ground signal conductor 116 is mechanically and electrically bonded to a large portion of the external, back surface of the base 124, in addition to the ground rings 106. Alternatively, additional ground contacts may be provided by signal leads connected to the TO package.

Figure 3B:
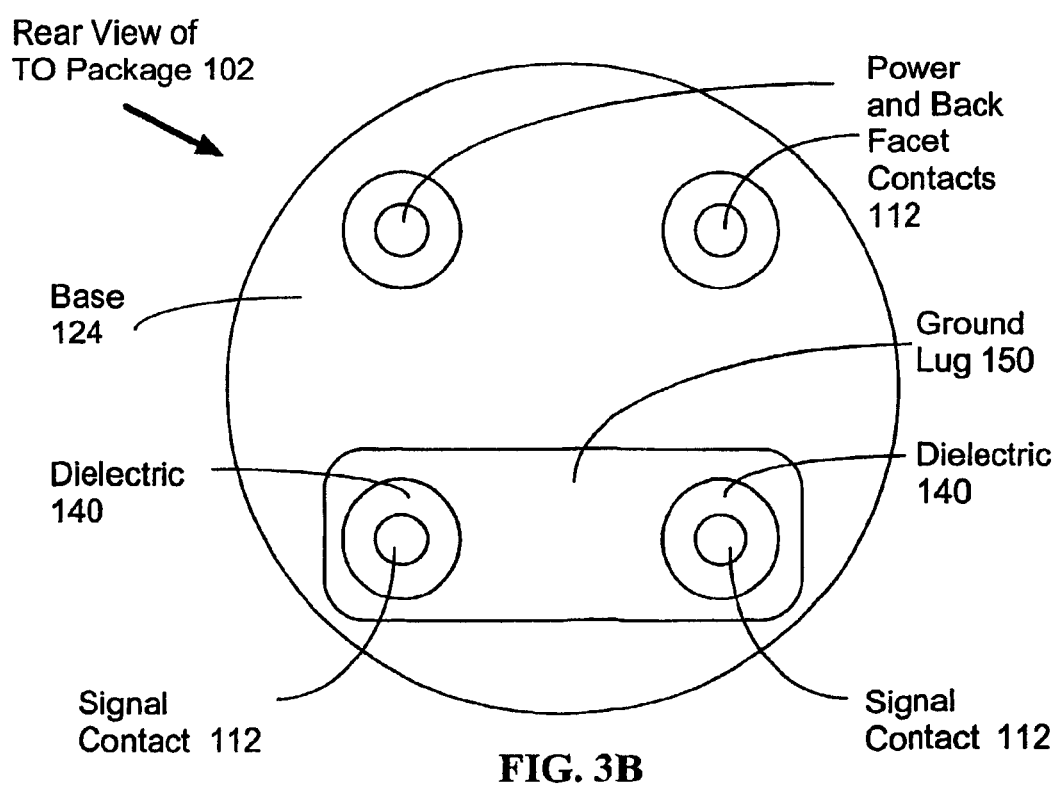

FIG. 3B depicts an alternate embodiment, in which a ground lug 150 is used instead of the ground rings 106 to provide a high quality ground connection to the base 124 and to prevent signal reflections in the high frequency data signal paths. The ground lug 150 is a preferably a highly conductive, thin metal lug bonded to the back, planar surface of the base 124, such as by solder, conductive epoxy or any other appropriate bonding or conductive attachment mechanism. The ground lug 150 rises above the back planar surface of the base 124, which facilitates the bonding of the ground signal conductor 116 of the circuit interconnect 104 to the ground lug. Alternately, the ground lug 150 may be implemented as a raised regions of the base 124, i.e., as an integral part of the base. The ground lug has two round (i.e., cylindrical) holes in it, aligned with the dielectric rings 140 surrounding the data signal contacts 112.

The use of a ground lug, instead of ground rings, typically does not require any change in the design of the circuit interconnect 104. As shown in FIG. 3B, the ground lug 150 is preferably positioned so as to surround the data signal contacts 112. If the TO package includes more than two high frequency data signal contacts 112, either the ground lug may be made larger or one or more additional ground lugs 150 may be positioned around those additional signal contacts 112 so as to provide a ground current path that is precisely positioned with respect to the data signal current flowing each of the data signal contacts 112.

The low impedance connection or bond between the ground signal conductor and the ground lug 150 is preferably formed by placing solder on the top surface of the ground lug or on the back surface of the ground signal conductor 116 and then soldering the ground signal conductor 116 to the ground lug 150. Alternately, the ground signal conductor 116 maybe mechanically and electrically connected to the ground lug 150 using a conductive epoxy or any other appropriate conductive attachment mechanism.

In yet another alternate embodiment, the base 124 of a TO package 102 may include both ground rings and ground lugs for forming ground current connections to the ground signal conductor 116 of the circuit interconnect 104.

Figure 4:
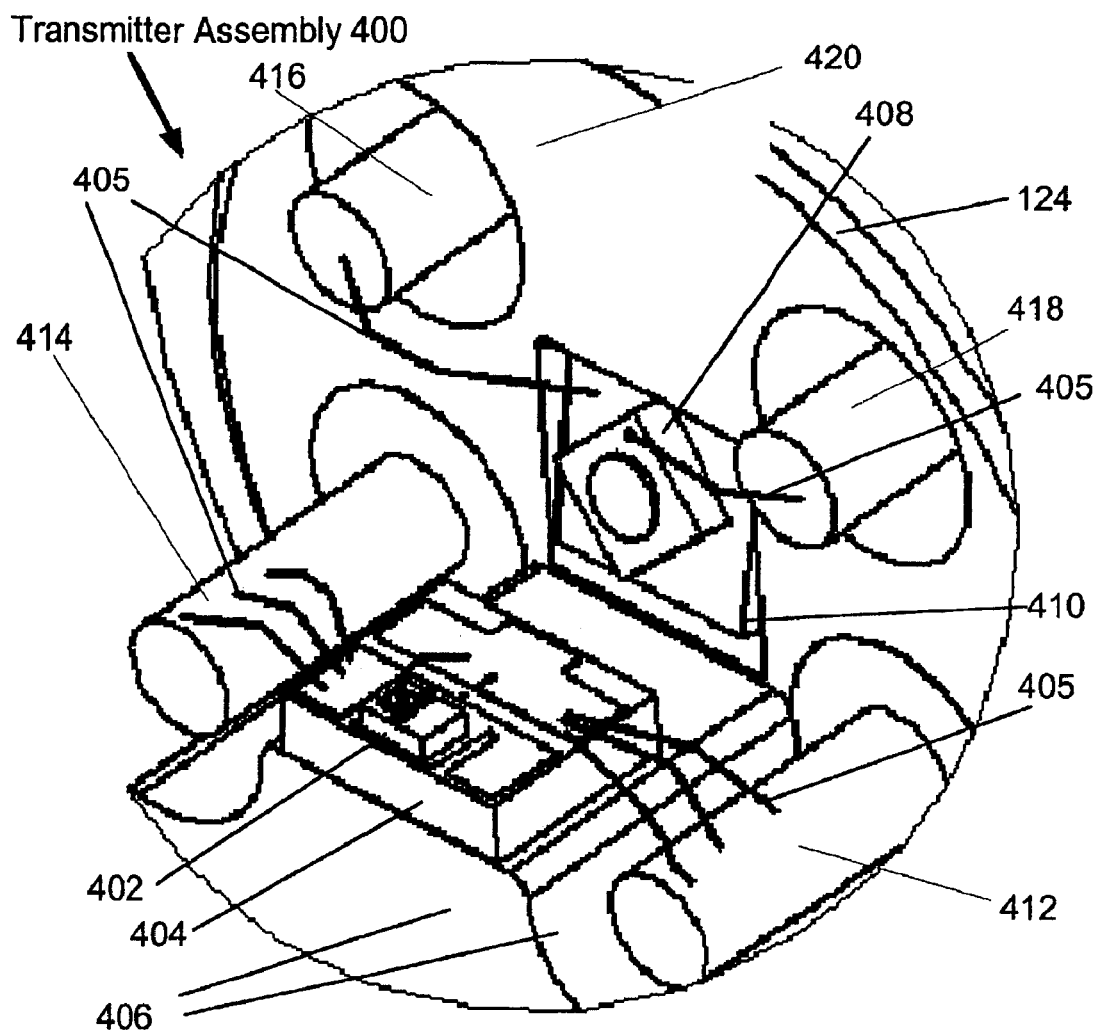
FIG. 4 is a diagram of a transmitter assembly in accordance with an embodiment of the invention.

Referring to FIG. 4, there is shown a transmitter optoelectronic assembly 400 in accordance with an embodiment of the present invention. The transmitter optoelectronic assembly 400 includes:

- a laser diode 402, such as an edge emitter or other type of laser diode;
- a laser submount 404, on which the laser diode is mounted; the laser submount 404 may be made of aluminum nitride or alumina ceramic; the laser submount 404 preferably incorporates one or more integrated or attached passive components, such as resistors, capacitors, and inductors, to provide improved impedance matching and signal conditioning;
- a laser pedestal 406 to which the submount 404 is attached; the laser pedestal 406 is a grounded, conductive structure having a partially concentric shape with respect to data signal contacts 412, 414 that extend through the base 124;
- a monitor photo diode 408 for detecting the light emitted from a back facet of the laser diode 402 in order to monitor the intensity of the light emitted by the laser diode 402;
- a monitor photo diode sub-mount 410 on which the monitor photo diode 408 is mounted; and
- a Transistor Outline (TO) package 420 incorporating controlled impedance glass-metal feedthroughs.

The partially concentric shape of the pedestal 406, which is held at the circuit ground potential, facilitates control of the impedance characteristics of the circuit that runs from the data signal contacts 412, 414, through bond wires 405 to the laser diode 402 and through the laser submount 404 and laser pedestal 406 of the TO package.

The laser diode 402 is activated when a positive voltage is applied across the p-n junction of the laser diode 402. In the preferred embodiment, data signal contacts 412, 414 form a differential data signal connection. The two contacts 412, 414 are electrically connected to the laser submount 404 via bond wires 405 or any another appropriate connection mechanism. One terminal of the laser diode 402 is in direct contact with the laser submount 404 and is therefore electrically connected with one of the differential data signal contacts 414 via a corresponding one of the bond wires 405. The other data signal contact 412 is electrically connected to the laser diode 402 via a bond wire 405 to the submount 404 and another bond wire connecting the second terminal of the laser diode 402 to the submount 404. The differential signal provided by data signal contacts 412, 414 supplies both a bias voltage and a time varying signal voltage across the p-n junction of the laser diode 402.

Figure 4A:
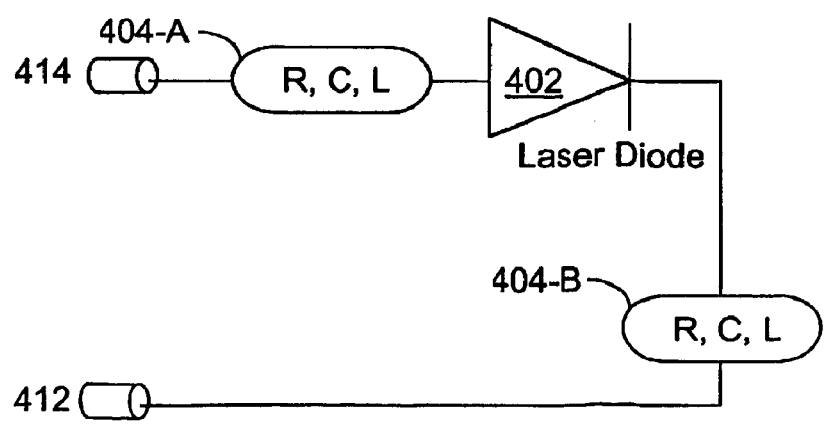
FIGS. 4A, 4B, 4C, 4D and 4E are circuit diagrams of the transmitter assembly of FIG. 4.
Figure 4B:
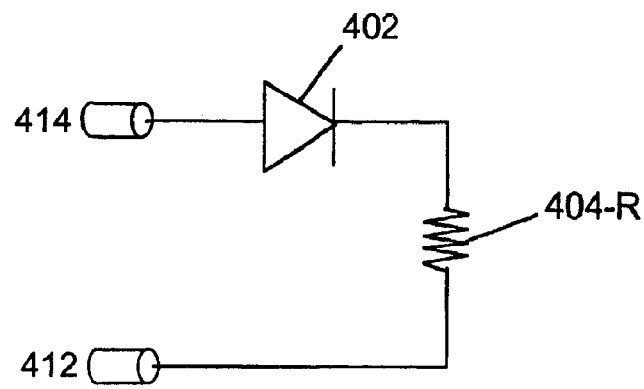
Figure 4C:
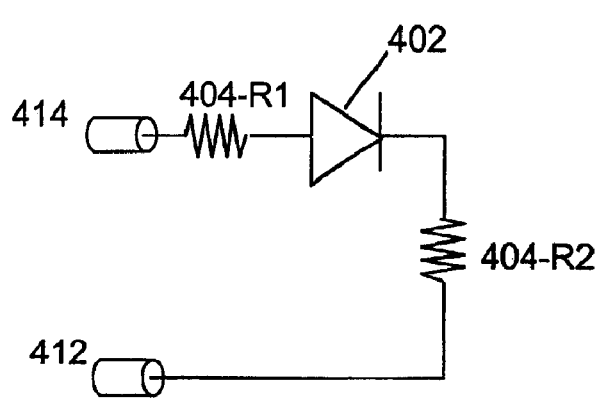
Figure 4D:
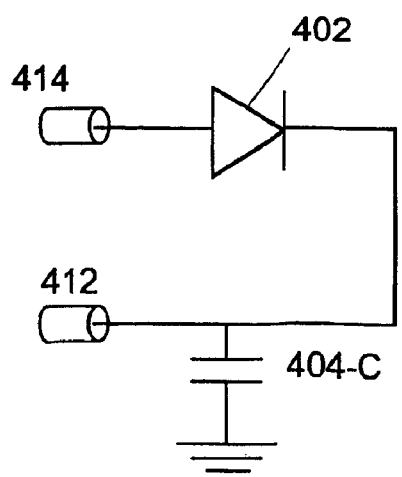
Figure 4E:
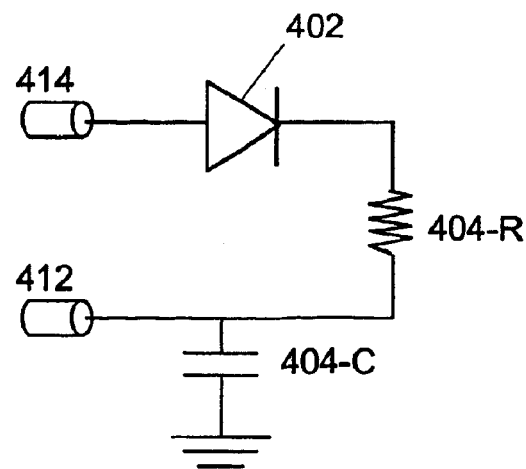

Improved impedance matching between the circuit interconnect and the electrical circuitry in a TO package is achieved by incorporating resistors, capacitors and/or inductors into the submount 404 for the laser diode to provide a network (e.g., an RL network, or LC network, or RLC network) that compensates for the impedance presented by the bond wires 405 between the data signal contacts 412, 414 extending through the TO package and the submount connection points. Typically, the bond wires are made of gold and have inductances of 1 to 5 nanoHenries. FIG. 4A is a circuit diagram of the circuit in which data signal contacts 412 and 414 are connected to the laser diode 402 through the laser submount 404. The resistance, capacitance and/or inductance of the submount 404 are adjusted so that the impedance of the electrical circuitry inside the TO package approximately matches the impedance of the circuit interconnect. FIGS. 4B, 4C, 4D and 4E are circuit diagrams for alternative impedance compensation networks that may be constructed. In FIG. 4B the submount is represented as a single resistor 404-R. In FIG. 4C the submount is represented as two resistors, 404-R1 and 404-R2, on either side of the laser diode 402. In FIG. 4D the submount is represented as a capacitor 404-C connected to ground. Finally in FIG. 4E the submount is represented as a resistor 404-R and a capacitor 404-C. Typically component values are 10 to 30 ohms (preferably about 20 ohms) for resistor 404-R and 0.6 to 1.0 picofarads (preferably about 0.75 picofarads) for capacitor 404-C. The impedance matching provided by the network incorporated into the submount is preferably optimized for a predefined range of operating frequencies, such as 3 GHz to 10 GHz. The predefined range of operating frequencies is preferably the same as the range of operating frequencies at which the optoelectronic device is expected to be used. In the preferred embodiments, the predefined range of operating frequencies includes a range of frequencies above 3 GHz.

Referring again to FIG. 4, as is understood by one skilled in the art, when the laser diode 402 is an edge emitter the laser diode 402 emits light in both the forward direction and the backward direction, from forward and back facets. The forward direction refers to the direction in which light is transmitted through a window of the TO package, while the backward direction refers to the opposite direction. The laser intensity in the backward direction is proportional to the laser intensity in the forward direction. Thus, it is useful to measure the intensity of the laser in the backward direction in order to track the laser intensity in the forward direction. Accordingly, a monitor photo diode 408 is positioned facing the back facet of the laser diode 402. A power supply voltage contact 416 is connected to the monitor photo diode submount 410 by a bond wire. The monitor photo diode 408 is in contact with the monitor photo diode submount 410 and is connected to the monitor photo diode data signal contact 418 by a bond wire. Thus, the monitor photo diode 408 is reverse biased between the power supply and the data signal contact 418. The transmitter assembly of FIG. 4 is operated in conjunction with a circuit interconnect having four data signal traces. The circuit interconnect, not shown, is preferably similar to the one shown in FIG. 2, but having four data signal traces 114. Each data signal trace contacts a respective one of the data signal contacts 412, 414, 416, and 418.

Figure 5:
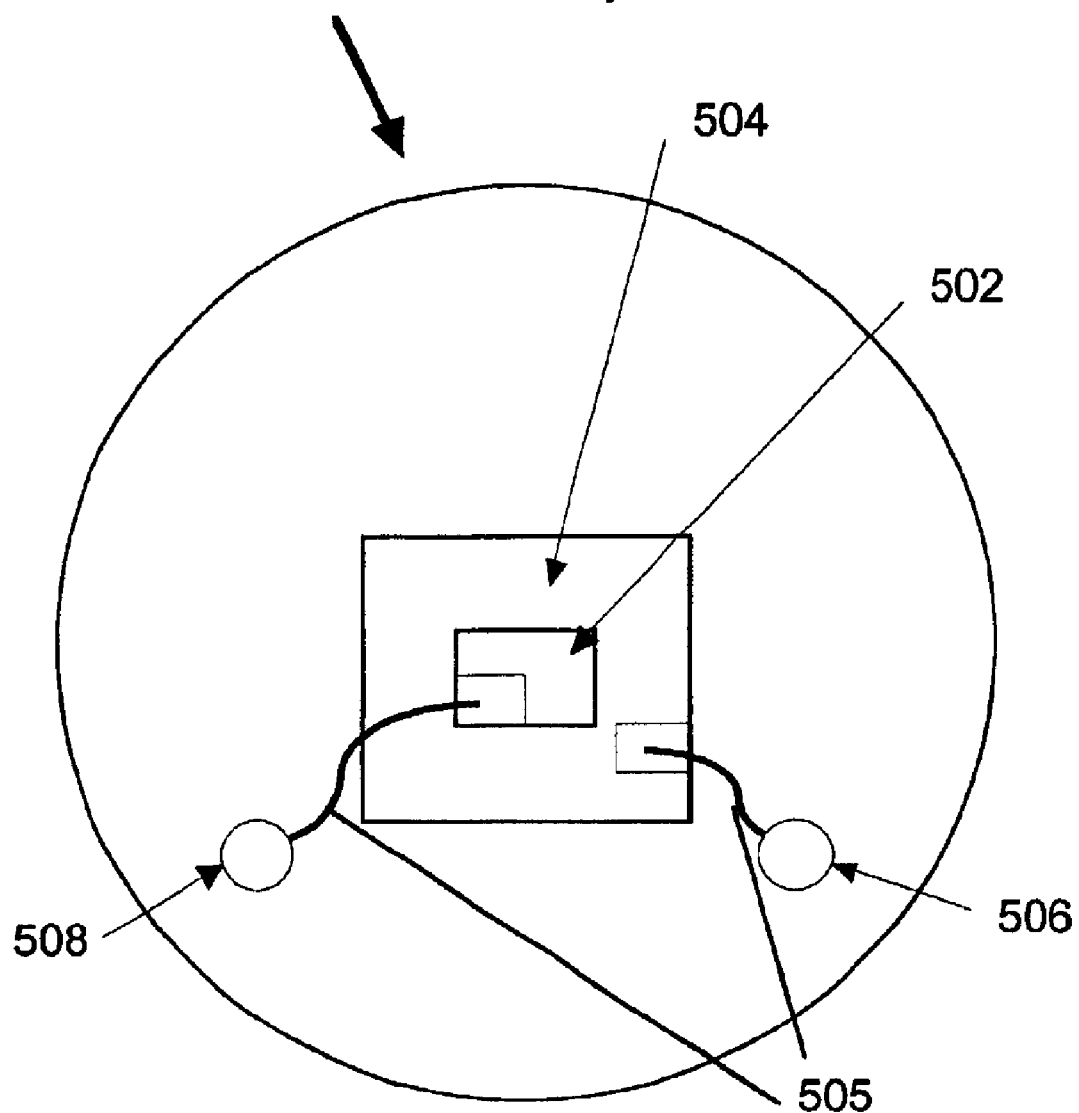
FIG. 5 is a diagram of a transmitter assembly in accordance with an alternate embodiment of the invention.

Other transmitter embodiments may include a Vertical Cavity Surface-Emitting Laser (VCSEL) transmitter assembly 500 as shown in FIG. 5. The VCSEL 502 is mounted to a submount 504, which is preferably a capacitor. The capacitor is mounted to the TO package 510. The VCSEL is electrically connected to the submount 504 via direct contact. Contact 506 is connected to the submount by a bond wire 505 and contact 508 is connected to the VCSEL by another bond wire 505. A differential signal is provided through contacts 506 and 508, which results in a positive voltage across the VCSEL's p-n junction thereby activating the VCSEL 502. The transmitter assembly of FIG. 5 is operated in conjunction with a circuit interconnect having two data signal traces, as well as a power connection trace, similar to the interconnects shown in FIGS. 1 and 2. Each data signal trace contacts a respective data signal contact 506, 508.

Figure 6:
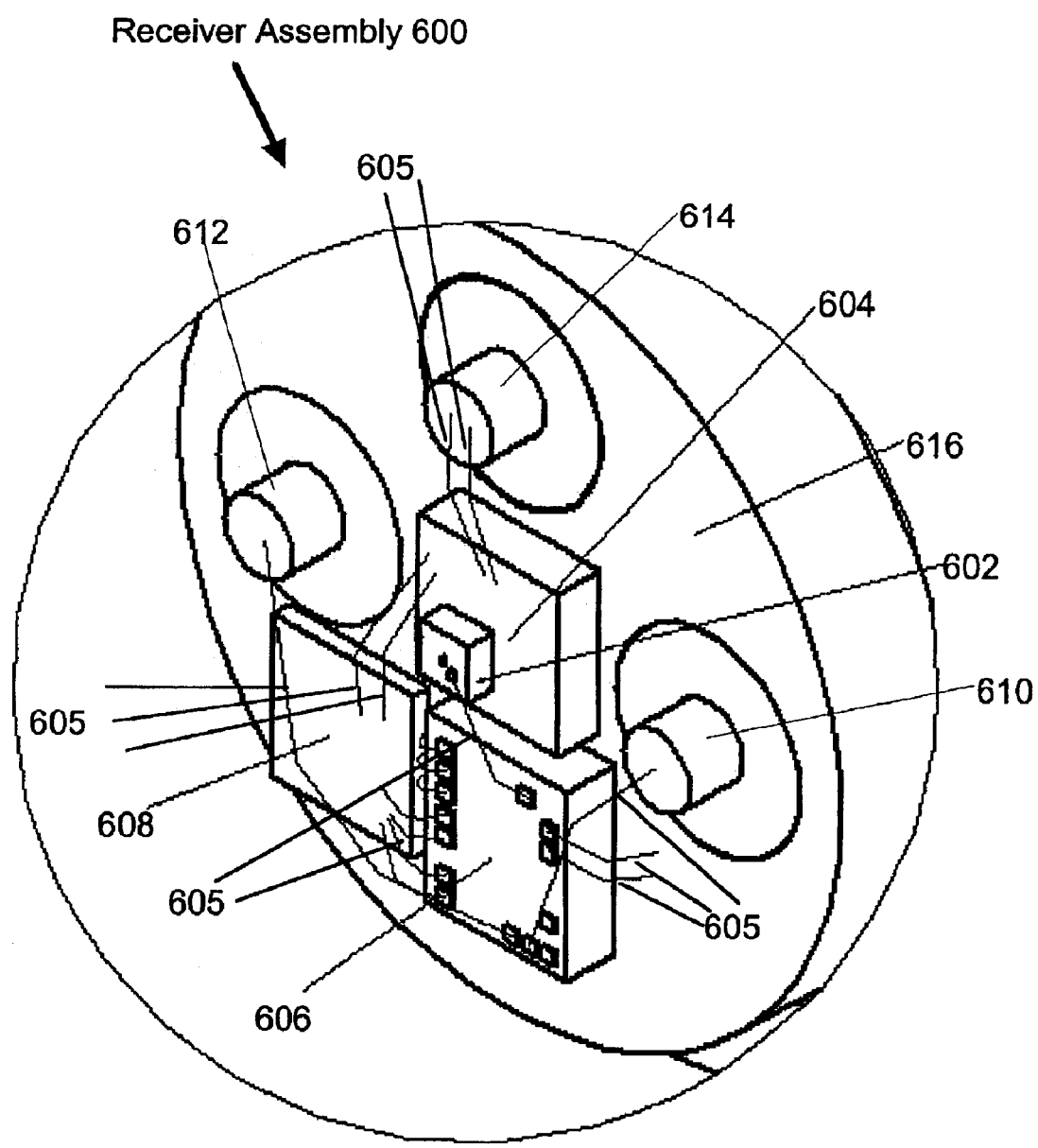
FIG. 6 is a diagram of a receiver assembly in accordance with an embodiment of the invention.

Referring to FIG. 6, there is shown an embodiment of a receiver optoelectronic assembly 600 in accordance with the present invention. The receiver optoelectronic assembly includes:

a photo diode 602;

a photo diode submount 604;

an integrated circuit preamplifier 606 attached to the photo diode 602 and the submount 604;

a capacitor 608 for filtering background noise; and a Transistor Outline (TO) package 616 incorporating controlled impedance glass-metal feedthroughs.

The photo diode submount 604 is preferably a capacitor that serves to filter noise from the power supply (Vcc) 614. The photo diode 602 is electrically connected to the submount 604 preferably through direct contact. The photo diode 602 is reverse biased between the charged capacitor 608 and a bond wire 605 to the integrated circuit preamplifier 606. The integrated circuit preamplifier 606 produces a pair of differential data signals through bond wires 605 to contacts 610 and 612. Finally, as is understood by those skilled in the art, the capacitor 608 is used by the integrated circuit preamplifier 606 to filter unwanted noise from the data signals. The receiver optoelectronic assembly of FIG. 6 is operated in conjunction with a circuit interconnect having three data signal traces (not shown, but similar to the circuit interconnects shown in FIGS. 1 and 2). Each data signal trace contacts a respective one of the data signal contacts 610, 612, and 614. The data signals from the photo diode are typically transmitted through the circuit interconnect to a received signal amplifier that is mounted on the circuit board connected to the circuit interconnect.

Figure 6A:
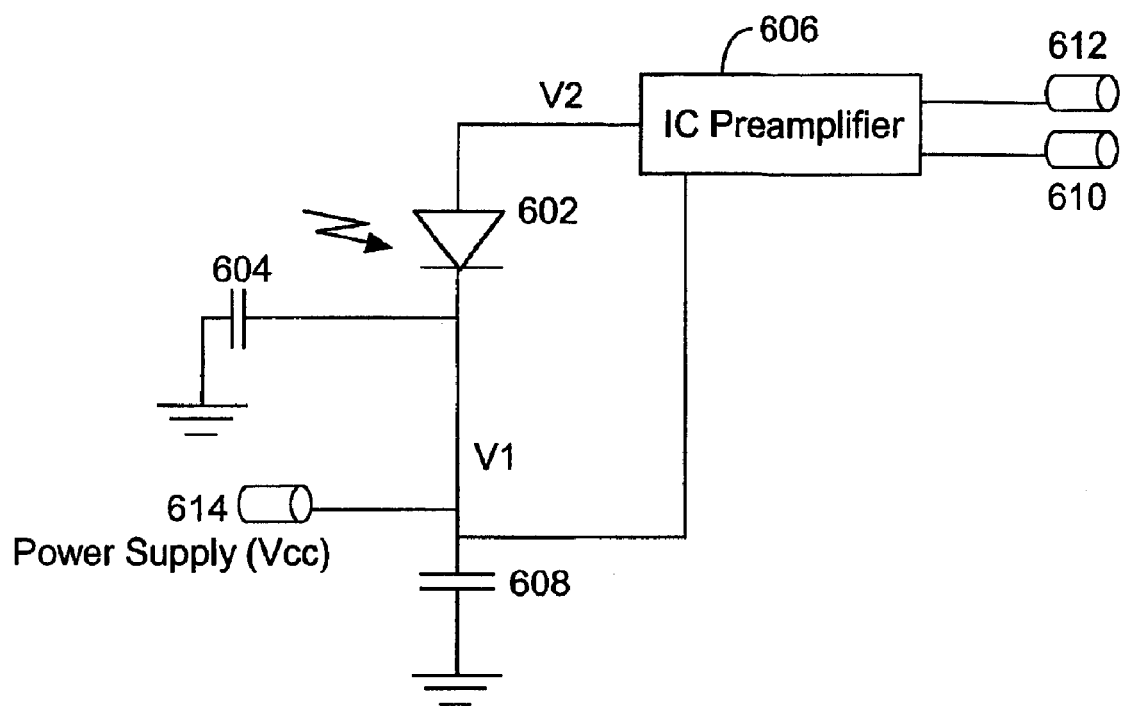
FIG. 6A is a circuit diagram of the receiver assembly of FIG. 6.

FIG. 6A is a circuit diagram of the receiver assembly shown in FIG. 6. The photo diode 602 is reverse biased so that V2 is less than V1. The output from the photo diode is amplified by the integrated circuit preamplifier 606 and then output through the data signal contacts 610 and 612. The photo diode submount is represented as a capacitor 604 that filters noise from the power supply (Vcc) 614. The capacitor 608 filters noise from the data signals.

Figure 7:
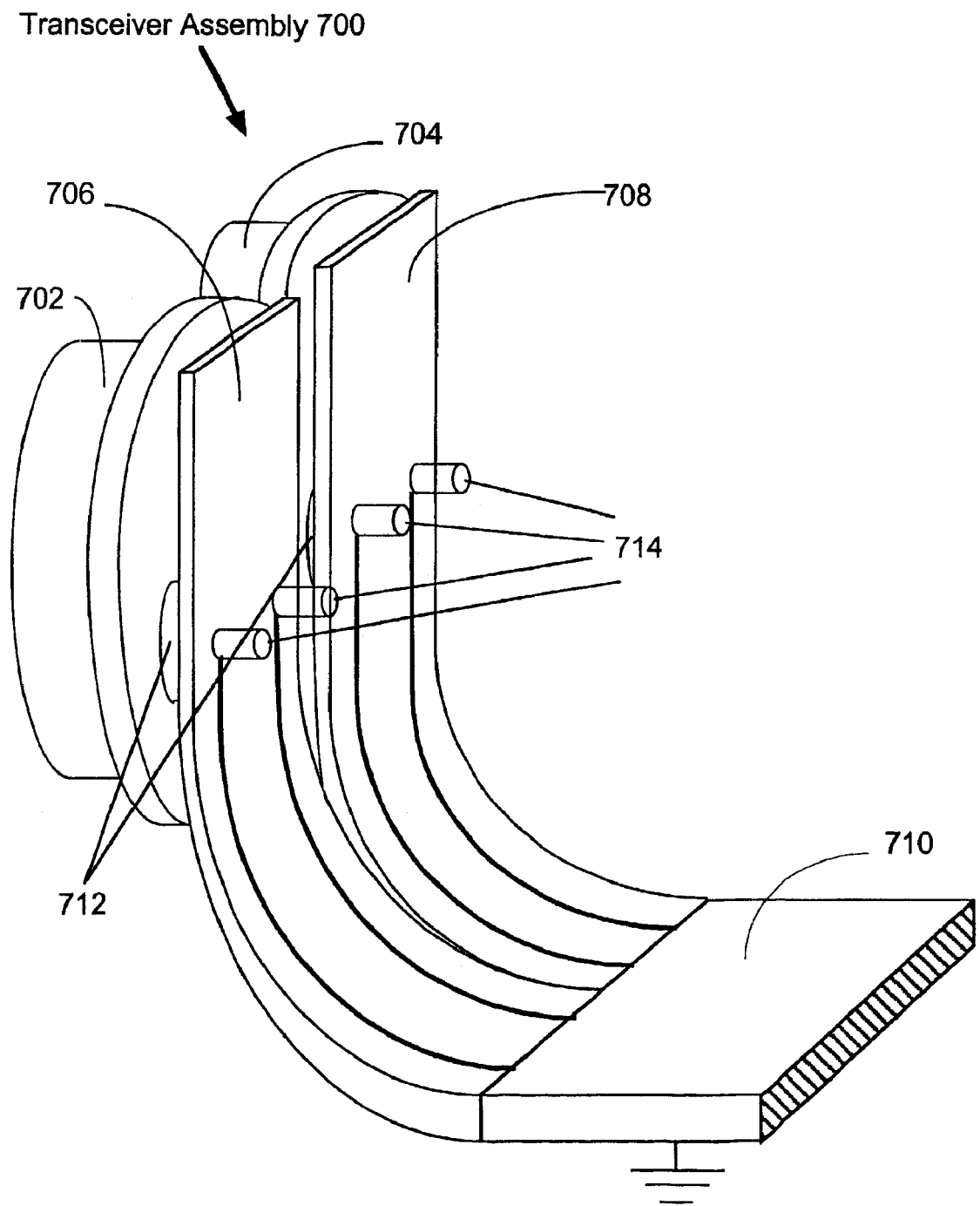
FIG. 7 is a diagram of a transceiver assembly in accordance with an embodiment of the invention.

FIG. 7 shows an embodiment of an optoelectronic transceiver 700 in accordance with the present invention. The optoelectronic transceiver 700 includes a transmitter TO package 702 and receiver TO package 704. The transmitter TO package 702 houses a light source such as a laser diode, and the receiver TO package 704 houses a detector such as a photo diode. Data signals are transmitted from external electrical circuitry 710 to the transmitter TO package 702 via the transmitter circuit interconnect 706. The data signals from the detector are transmitted through the receiver TO package 704 to the external electrical circuitry 710 via the receiver circuit interconnect 708. Both the transmitter circuit interconnect 706 and the receiver circuit interconnect 708 ground their respective TO package through direct contact with the ground rings 712 (two of which are shown in FIG. 7) surrounding the data signal contacts 714.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. An optoelectronic assembly comprising:
 a plurality of transistor outline packages housing a like plurality of optoelectronic devices;
 a plurality of circuit interconnects, each respective circuit interconnect coupled to a respective one of the optoelectronic devices and a respective one of the transistor outline packages, wherein each respective circuit interconnect comprises an elongate, flexible insulator including:
  a plurality of data signal traces on a first side for transmitting a plurality of data signal currents between the respective optoelectronic device and a respective device external to the respective transistor outline package; and
  a conductor on a second side for transmitting a ground current between the respective transistor outline package and the respective device external to the respective transistor outline package; the conductor having a current path that runs parallel to the plurality of data signal traces; and
 a circuit board on which each of the respective devices external to the transistor outline packages is mounted;
 wherein the insulator, the conductor and the data signal traces of each of the plurality of circuit interconnects are configured so that, for operation in a predefined range of frequencies above 3 GHz, impedance of the circuit interconnect approximately matches impedance of the respective device external to the transistor outline package.

2. The optoelectronic assembly of claim 1, wherein each transistor outline package includes a plurality of signal leads; and
 the insulator, the conductor and the data signal traces of each of the plurality of circuit interconnects are configured so that, for operation in the predefined range of frequencies, impedance of the circuit interconnect approximately matches impedance of the signal leads of the respective transistor outline package.

3. The optoelectronic assembly of claim 2, wherein the impedance each signal lead of the plurality of signal leads of each transistor outline package approximately matches impedance of circuitry within the transistor outline package.

4. The optoelectronic assembly of claim 1, wherein
 each transistor outline package includes a signal lead; and
 each transistor outline package of the plurality of transistor outline packages includes a pedestal shaped to be concentrically positioned around at least a portion of the signal lead.

5. The optoelectronic assembly of claim 1, wherein
 a first transistor outline package of the plurality of transistor outline packages includes a signal lead; and
 the first transistor outline package includes a pedestal shaped to be concentrically positioned around at least a portion of the signal lead.

6. The optoelectronic assembly of claim 1, wherein the conductor on the second side of each circuit interconnect directly contacts the respective transistor outline package.

7. The optoelectronic assembly of claim 1, wherein each transistor outline package includes a signal lead electrically connected to the optoelectronic device housed in the transistor outline package, a concentric dielectric ring situated around the signal lead, and a concentric ground ring situated around the dielectric ring, the concentric ground ring directly contacting the conductor on the second side of the respective circuit interconnect.

8. An optoelectronic transceiver comprising:
 a light source housed in a transmitter transistor outline package;
 a detector housed in a receiver transistor outline package;
 a transmitter circuit interconnect coupled to the light source and the transmitter transistor outline package, wherein the transmitter circuit interconnect includes:
  a first data signal trace on a first side for transmitting data signal current from the light source to a first device external to the transistor outline package; and
  a first conductor on a second side for transmitting a ground current between the transmitter transistor outline package and the first device external to the transistor outline package; the first conductor having a current path that runs parallel to the first data signal trace; wherein the first conductor and the first data signal trace are configured so that, for operation in a predefined range of frequencies above 3 GHz, impedance of the transmitter circuit interconnect approximately matches impedance of the light source housed in the transmitter transistor outline package;
 a receiver circuit interconnect coupled to the detector and the receiver transistor outline package, wherein the receiver circuit interconnect includes:
  a second data signal trace on a first side for transmitting signal current from the detector to a second device external to the transistor outline package; and
  a second conductor on a second side for transmitting a ground current between the receiver transistor outline package and the second device external to the transistor outline package; the second conductor having a current path that runs parallel to the second data signal trace; wherein the second conductor and the second data signal trace are configured so that, for operation in a predefined range of frequencies above 3 GHz, impedance of the receiver circuit interconnect approximately matches impedance of the detector housed in the receiver transistor outline package.

* * * * *